United States Patent
Masini et al.

(10) Patent No.: US 7,358,527 B1
(45) Date of Patent: Apr. 15, 2008

(54) SYSTEMS AND METHODS FOR TESTING GERMANIUM DEVICES

(75) Inventors: Gianlorenzo Masini, Carlsbad, CA (US); Cary Gunn, Encinitas, CA (US)

(73) Assignee: Luxtera, Inc., Carlsbad, CA (US)

( * ) Notice: Subject to any disclaimer, the term of this patent is extended or adjusted under 35 U.S.C. 154(b) by 183 days.

(21) Appl. No.: 11/347,663

(22) Filed: Feb. 3, 2006

Related U.S. Application Data

(60) Provisional application No. 60/649,779, filed on Feb. 3, 2005.

(51) Int. Cl.
*H01L 23/58* (2006.01)
(52) U.S. Cl. .................... 257/48; 257/E31.001
(58) Field of Classification Search .......... 257/48, 257/E31.001
See application file for complete search history.

(56) References Cited

U.S. PATENT DOCUMENTS

| | | | | |
|---|---|---|---|---|
| 5,990,488 | A * | 11/1999 | Nistler et al. | 257/48 |
| 6,342,401 | B1 * | 1/2002 | Tom | 438/17 |
| 6,396,076 | B1 * | 5/2002 | Tom | 257/48 |
| 6,770,907 | B2 * | 8/2004 | Abadeer et al. | 257/48 |
| 2003/0094608 | A1 * | 5/2003 | Abadeer et al. | 257/48 |

* cited by examiner

*Primary Examiner*—Evan Pert
(74) *Attorney, Agent, or Firm*—Knobbe Martens Olson & Bear LLP

(57) ABSTRACT

Systems and methods are disclosed for a test device that is configured to allow assessment of the quality of germanium devices. In one embodiment, the test device is formed on the same substrate as the germanium devices, and includes a plurality of germanium components that are substantially similar to those found in the germanium devices. Such example measurement can used to estimate various quality parameters associated with fabrication of the germanium devices.

21 Claims, 6 Drawing Sheets

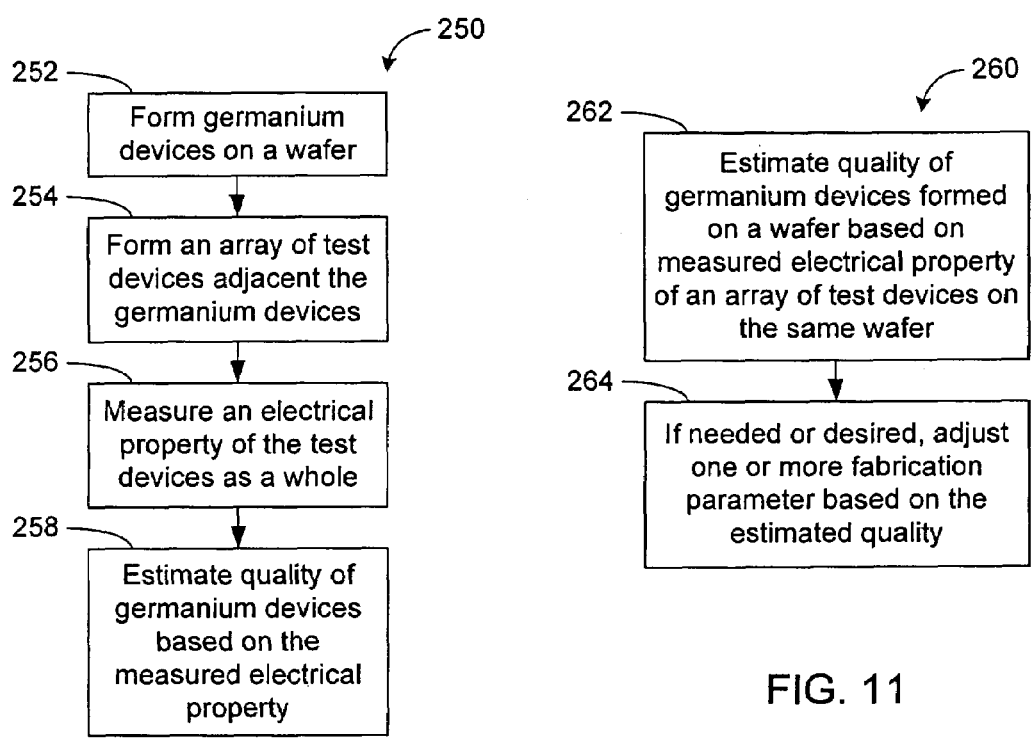

SYSTEMS AND METHODS FOR TESTING GERMANIUM DEVICES

PRIORITY APPLICATION

This application claims priority benefit of U.S. Provisional Patent Application No. 60/649,779 filed Feb. 3, 2005, titled "Device Architecture and Design Rules for Germanium Process," which is incorporated herein by reference in its entirety.

BACKGROUND

1. Field

The present disclosure generally relates semiconductor devices, and more particularly, to systems and methods for testing germanium devices and processes.

2. Description of the Related Art

Use of germanium in semiconductor devices can provide certain advantages. For example, a germanium photodetector can detect near infrared light used in fiber optical communications.

Use of germanium devices can therefore enable optoelectronic functionalities in wavelength regions otherwise unaccesible to silicon devices. These optoelectronic functions can be used to transport information at a much higher speed and efficiency than those allowed by electrical links.

SUMMARY

A wide variety of systems, devices, methods, and processes comprising embodiments of the invention are described herein. Various embodiments include electrical structures comprising at least one functional device and at least one test device. In certain embodiments, the at least one functional device and at least one test device may be disposed on the same substrate. Certain of these various embodiments include structures and methods relating to test devices that are configured to provide an assessment of the quality of the functional devices.

Either or both of the at least one test device and the at least one functional device may comprise germanium. Some non-limiting examples of germanium test devices include germanium resistors or germanium-silicon junction diodes. Some non-limiting examples of germanium functional devices include photodiodes, transistors, diodes, resistors, etc. In one embodiment, the test device can be formed on the same substrate as the germanium devices, and can include a plurality of germanium components, such as for example a resistive path comprising germanium, or diode heterojunctions comprising germanium and silicon, that are substantially similar to those found in the germanium functional devices. In some embodiments, a plurality of test devices are used. The germanium components of the test devices can be electrically connected in a selected manner (e.g., in series or parallel), so that measurement of the test devices can yield a value that amplifies an effect of a defect or increases the likelihood of detection of a defect or otherwise enhances the ability to assess the quality of the germanium functional devices. For example, N germanium components can be connected in series, so that a resistance measurement (or a current measurement) of the test devices yields a cumulative effect of resistive property of the germanium devices. Such example measurement can be used to estimate various quality parameters associated with fabrication of the germanium devices. Other embodiments of the invention are also possible.

One embodiment of the present disclosure relates to a semiconductor device structure that includes a plurality of functional semiconductor devices formed on a substrate. At least one of the functional semiconductor devices includes a germanium component. The semiconductor device further includes at least one test device formed on the substrate. The test device includes at least one germanium test component, with the germanium test component being substantially similar to the germanium component of the functional semiconductor devices. The germanium test component is electrically connected between first and second contacts, and test pads are electrically connected to the first and second test contacts. Measurement of an electrical parameter associated with the test device via the test pads provides a measure of a quality of the functional semiconductor devices.

Another embodiment of the present disclosure relates to an apparatus for testing a device having one or more germanium components formed on a substrate. The apparatus includes at least one germanium test component formed on the substrate, with the test germanium component being substantially similar to the one or more germanium components. The at least one germanium test component is electrically connected between first and second test contacts. Measurement of an electrical parameter between the first and second test contacts provides a value that can be indicative of a quality of the device.

Yet another embodiment of the present disclosure relates to a method for testing a germanium device formed on a substrate. The method includes forming a test device on the substrate. The test device includes a plurality of test germanium components that are substantially similar to germanium components found on the germanium devices. The plurality of test germanium components are electrically connected between first and second test contacts. The method further includes measuring an electrical parameter of the test device between the first and second test contacts, with the measurement being indicative of a quality of the germanium devices.

Yet another embodiment of the present disclosure relates to a method for manufacturing a germanium device. The method includes forming at least one functional semiconductor device having a germanium component. The method further includes forming at least one test device having at least one germanium test component. The germanium test component can be substantially similar to the germanium component of the at least one functional semiconductor device. The method further includes providing electrical connections to the at least one test device to allow measurement of an electrical parameter that can be indicative of a quality of the at least one functional semiconductor device and the at least one test device.

Yet another embodiment of the present disclosure relates to a method for testing a wafer having a germanium device. The method includes providing electrical probes to test pads formed on a scribe grid lane of the wafer. The test pads are electrically connected to at least one test device having at least one germanium component and also formed on the scribe grid lane. The method further includes measuring an electrical parameter of the at least one test device. The method further includes estimating a quality of the germanium device based at least in part on the electrical parameter of the at least one test device.

Still other embodiments are possible.

BRIEF DESCRIPTION OF THE DRAWINGS

FIG. 10 shows one embodiment of a process for estimating the quality of germanium devices based on a measured electrical parameter of the test device; and FIG. 11 shows one embodiment of a process for adjusting a process configured to fabricate germanium devices.

These and other aspects, advantages, and novel features of the present teachings will become apparent upon reading the following detailed description and upon reference to the accompanying drawings. In the drawings, similar elements have similar reference numerals.

DETAILED DESCRIPTION OF SOME EMBODIMENTS

Structures, devices, systems, methods and processes which represent various embodiments and example applications of the present disclosure will now be described with reference to the drawings.

As is generally known, use of germanium in semiconductor devices can provide certain advantages. For example, a germanium photodetector can detect near infrared light used in fiber optical communications. Integration of germanium detectors in standard silicon CMOS technology, can, therefore enable optoelectronic functionalities in wavelength regions otherwise inaccessible to silicon. These optoelectronic functions can be used to transport information across a chip and to locations outside the chip at a much higher speed and efficiency than those allowed by electrical links. However, issues such as on-wafer and lot-to-lot consistency, and process troubleshooting, the quality of germanium structures needs to be monitored. Such monitoring can be done using destructive techniques such as cross section SEM and TEM. Various embodiments of the present disclosure relates to testing and/or monitoring germanium devices by fabricating and electrically testing appropriate structures whose characteristics are strongly correlated with germanium quality. In addition to being non-destructive, various techniques of the present disclosure can be performed on-line, during wafer processing in the silicon foundry.

However, use of germanium has generally been hindered due to, for example, germanium being considered more difficult to work with and being a less common element than the more abundant silicon.

Various embodiments of the present disclosure relates to designs and methods for testing germanium devices. As described herein, various techniques and designs provided by the present disclosure allows testing of germanium devices in an efficient manner.

Figure 1:
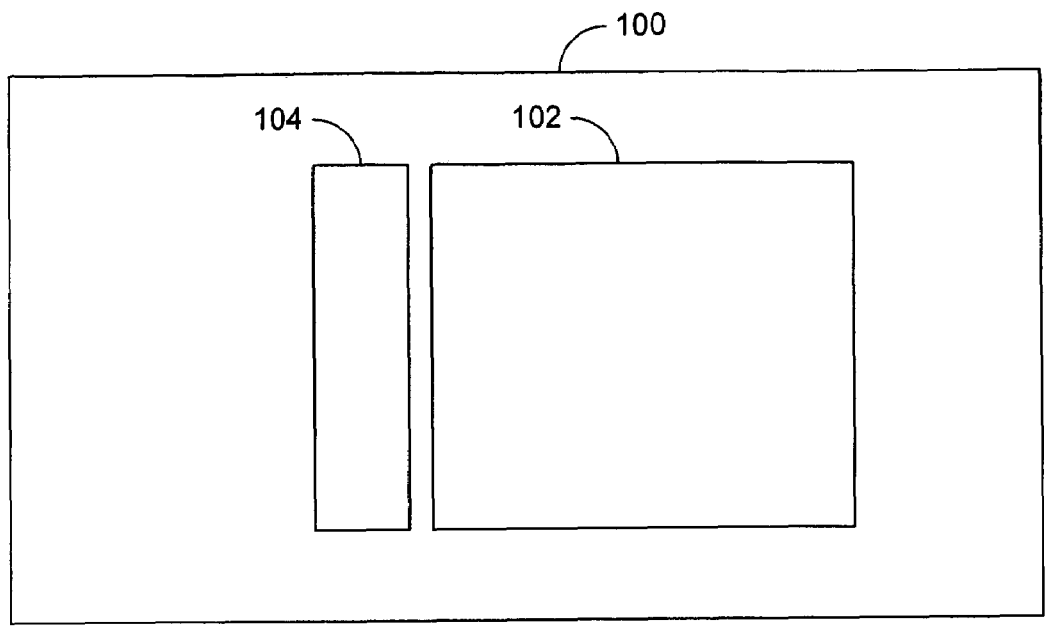
FIG. 1 shows a block diagram of one embodiment of a semiconductor device structure comprising a plurality of functional germanium devices used in the operation of the device structure, and a test assembly that includes a plurality of test devices used in the test of the semiconductor device structure.

FIG. 1 shows a block diagram of one embodiment of a semiconductor device structure 100 comprising a plurality 102 of germanium devices. These germanium devices are used in the operation of the semiconductor device structure 100. Accordingly, the germanium devices may be referred to herein as "functional" devices. For example, the semiconductor device structure 100 comprises a semiconductor chip and the plurality of germanium devices 102 comprises a plurality of transistors or other electronic and optoelectronic (such as waveguides, modulators, couplers) devices that are used for connectivity and to provide analog or digital functions. Either or both the semiconductor device structure 100 and the plurality of germanium devices 102, however, may comprise other structures in other embodiments.

In certain preferred embodiments, the semiconductor device structure 100 comprises, for example, a silicon wafer or substrate on which the germanium devices 102 are formed. The semiconductor device structure 100 may include other materials as well and may be doped.

The semiconductor device structure 100 shown in FIG. 1 further comprises a test assembly 104 formed thereon. The test assembly 104 comprises a plurality of test devices used to test the semiconductor device structure 100. In certain embodiments, for example, the plurality of test devices are used to test the plurality of germanium devices 102 that are used in the operation of the semiconductor device structure 100. In some embodiments, the test devices can be substantially similar to functional ones. In one example application where germanium is used to form waveguide photodiodes, one embodiment of the test devices are connected electrically to corresponding test pads, but have no optical connection. In some embodiments, geometry and doping types can be substantially similar to those of functional devices. In some embodiments, test devices can be configured to replicate a selected parameter (such as junction area or perimeter). In one embodiment, the test assembly 104 can be formed adjacent the array 102.

As described herein, one or more electrical properties associated with the test assembly 104 can be used to estimate one or more parameters associated with the quality of the germanium devices 102 and/or the corresponding fabrication process(es). Thus, having the test assembly 104 in close proximity to the germanium devices 102 can be preferable, in some embodiments, since such proximity is more likely to result in a substantially similar fabricating condition for both germanium devices 102 and the test assembly 104.

Figure 2A:
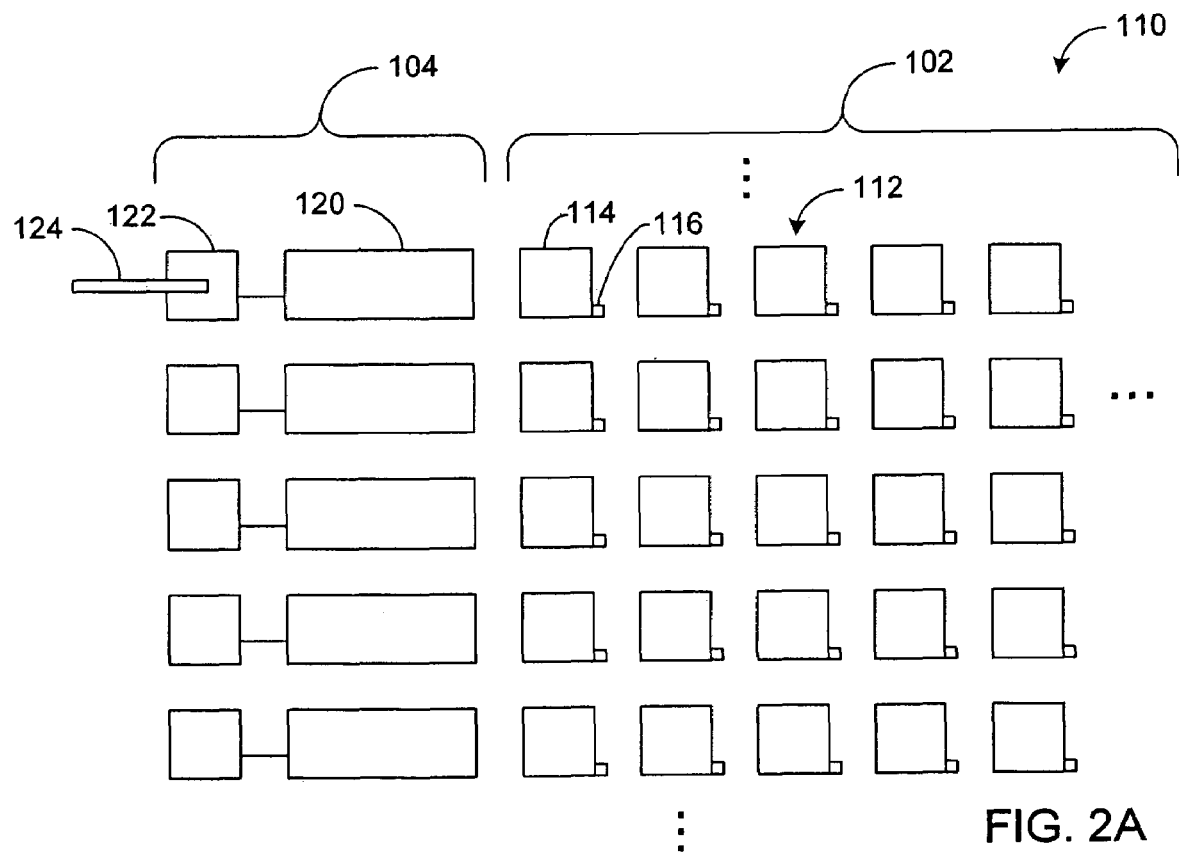
FIG. 2A shows that in one embodiment, the plurality of functional germanium devices comprises an array of germanium devices adjacent to the test assembly.

FIG. 2A shows one embodiment of an example configuration 110 for the array 102 of individual germanium devices and the test assembly 104. As shown, the array 102 can include a plurality of individual germanium devices 112. Each device 112 is shown to include a germanium component 116 in electrical contact with two or more pads 114. It will be understood that in some embodiments, each device 112 can have one or more germanium components 116. Similarly, the component 116 and/or the electrical contact or pad can be excluded from one or all of the devices. In one embodiment, the germanium devices 112 can be physically severed to form separate units.

In one embodiment, as shown in FIG. 2A, the test assembly 104 can include a plurality of test devices 120 positioned along one edge of the array 102. In one embodiment, one test device 120 can be formed for each row or column of the germanium devices 112. Other arrangements, however, are possible. In one embodiment, a test pad 122 can be formed adjacent each test device 120. The test pad 122 can be configured to provide electrical connections to the test device 120. In FIG. 2A, an example test probe assembly 124 is depicted as being used to measure an electrical property of the test device 120 via the test pad 122. Other forms of contacts may also be used.

In one embodiment, the test assembly 104 is separated from the plurality of germanium devices 110. In certain situations, close proximity is more likely to result in a substantially similar fabricating condition for both germanium devices 102 and the test assembly 104. In other embodiments, however, this distance may be larger and need not be adjacent. For example, structures or components may be disposed between the plurality of germanium devices 102 and the test assembly 104.

Figure 2B:
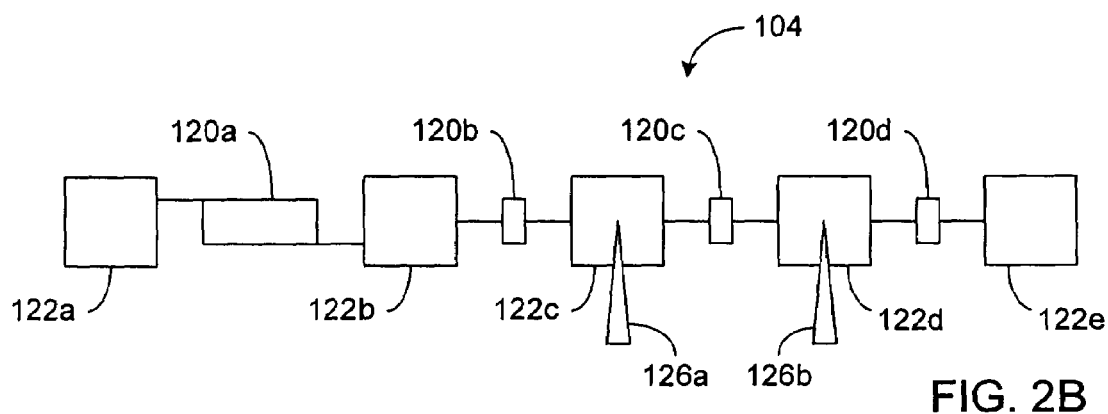
FIG. 2B shows that in one embodiment, the test assembly can include one or more test devices interspersed between pads so that an electrical property of one or more test devices can be measured by probing appropriate pads.

FIG. 2B shows that in one embodiment, groups of one or more test devices 120 can be interspersed between pads 122. For example, a test device group 120a is shown to be positioned between pads 122a and 122b. Similarly, a test device group 120b is shown to be positioned between pads 122b and 122c. A given test device group can include one or more test devices. For example, the group 120a can include more than one test device, and the group 120b can represent one test device. Any combination of one-device and/or more-than-one-device can be used.

FIG. 2B also shows that in one embodiment, probes 126a and 126b can measure an electrical property of a given test device group. For example, probe 126a is in contact with pad 122c, and probe 126b is in contact with pad 122d, to thereby measure the test device group 120c. Similarly, probing of pads 122b and 122c can measure the test device group 120b.

Figure 3:
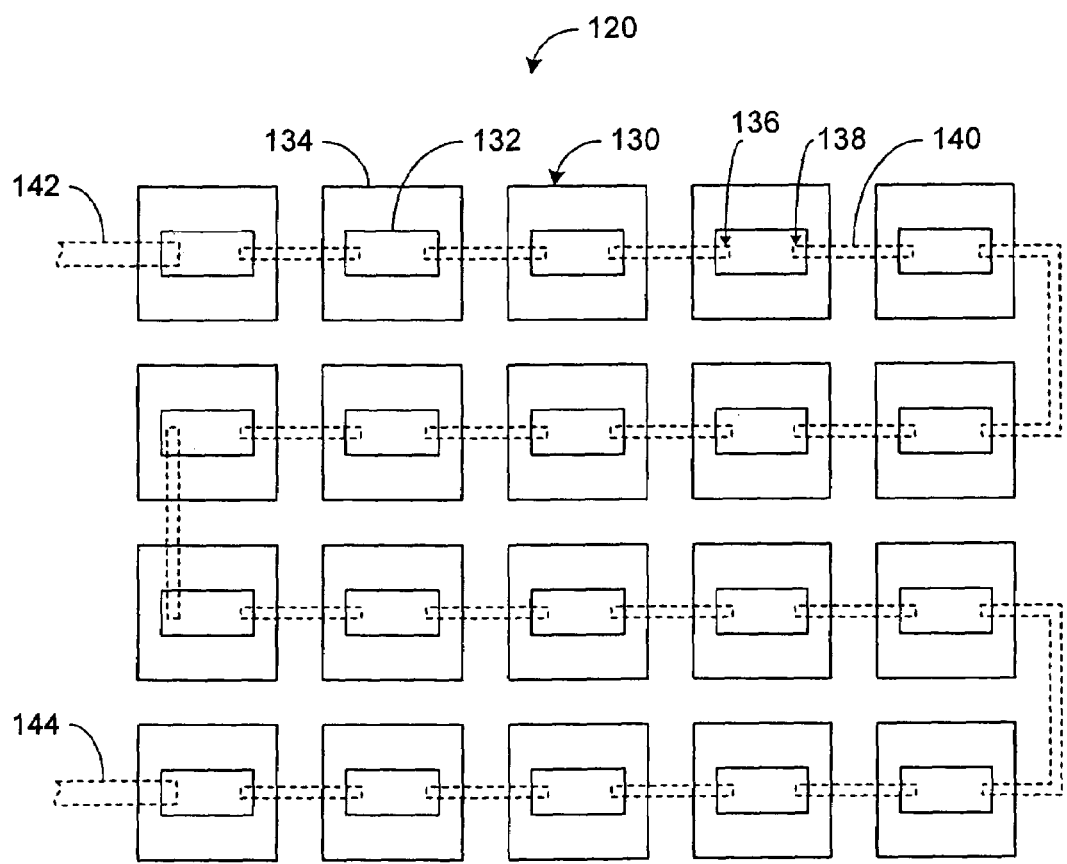
FIG. 3 shows that in one embodiment, each of the test devices can include a plurality of germanium components that are electrically connected in series so that an electrical parameter, such as resistance, is more pronounced.

FIG. 3 shows one embodiment of the test device 120 of FIG. 2A, where the test device 120 can include a plurality of test elements 130. Each test element 130 can include a test germanium component 132 formed on a substrate 134. The substrate 134 may be the same substrate on which the germanium components 116 (FIG. 2A) are formed, or a different substrate.

In one embodiment, as shown in FIG. 3, the test germanium component 132 may include first and second electrical contacts 136 and 138. Such contacts can facilitate interconnection of test germanium components in various manners via electrical conductors 140.

In the example configuration shown in FIG. 3, the plurality of test germanium components 132 are electrically connected in series. First and second conductors 142 and 144 are shown to be connected to the two ends of the series connected plurality of test germanium components 132. Thus, for example, a resistance measurement across the first and second conductors 142 and 144 yields substantially a sum of the resistances of all the components 132 in the series. It will be understood that the test germanium components 132 can be electrically connected in a non-series manner.

In one embodiment, the test germanium components 132 of the test device 120 (FIG. 3) are substantially similar in structure to the individual germanium components 116 of the germanium devices 112 (FIG. 2A). Such similarity can be achieved, for example, by forming the test germanium components 132 and the individual germanium components 116 in a substantially similar manner and possibly simultaneously during the same processing steps.

In one embodiment, the test germanium components 132 of the test device 120 are not necessarily substantially similar in structure to the individual germanium components 116 of the germanium devices 112. The test germanium components 132 can be fabricated so that one or more of their features approximate one or more properties of the individual germanium components 116, even if the structures are not the same. For example, if the test germanium components 132 are to be used for estimating a contact failure rate, then the contacts of the test components 132 may be configured similarly; and differences in other features of the individual devices 112 and components may not be as important.

Based on the foregoing, one can see that the test germanium components 132 can be used to test and approximate quality of or the likelihood of defects in individual germanium components 116. In one embodiment where the test device 120 includes multiple germanium components 132, a single measurement of the test device 120 can yield a result that is either representative of multiple individual germanium components 116, or an amplification of a property of a single germanium component 116.

For example, suppose that a given test device has N test germanium components connected in series. In an example situation where quality of electrical contacts on the germanium components is a concern, a determination of an electrical continuity in the test device can provide a level of confidence in the quality of the individual germanium components without measuring for continuity of each individual germanium component.

In another example, quality of germanium material (defects, impurity level, etc.) may be of interest. Such material quality may be estimated or compared to some known standard by measurement of resistance of the germanium material. Thus, a resistive effect of a given individual germanium component can be amplified approximately N-fold if the N test germanium components (connected in series) were subjected to similar fabrication conditions as that of the individual germanium components. If the likelihood of a defect in a given germanium component is low, employing a multiplicity of germanium components may still yield a measurable output value and this output can be related to the likelihood of the defect based on the number of test components used.

In some embodiments, the number (N) of test germanium components 132 in a given test device 120 can vary depending on design parameters such as test functionality. Moreover, it is not necessary that all of the test devices 120 have the same number of test germanium components. In non-limiting examples, one embodiment of a test device can includes one test component, two or more, ten or more, fifty or more, 100 or more, or 1000 or more test germanium components. All the test components in a test device may be the same or one or more maybe be different.

FIGS. 4-7 show some non-limiting examples of germanium components. In some embodiments, germanium components of the test device (120 in FIG. 2A) are substantially similar to that in the array (102 in FIG. 2A). In some embodiments, however, similarity between the germanium components of the test device and the array may be limited to selected portion(s) to allow testing of one or more selected properties of the germanium components. In other embodiments, the germanium components of the test devices 120 may be wholly different than the components in the individual functional germanium devices 102.

Figure 4:
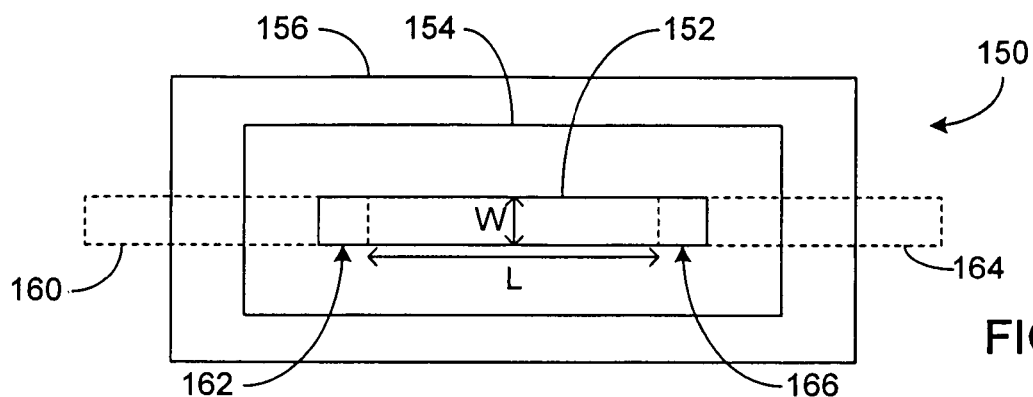
FIG. 4 shows one embodiment of an example germanium component that can be part of the functional germanium device and the test device, where the germanium component includes a resistive germanium strip formed on silicon with electrical contacts formed on two ends of the germanium strip.

FIG. 4 shows one embodiment of an example germanium component 150 that can be formed as part of individual devices (112 in FIG. 2A) and test devices (120 in FIGS. 2 and 3). The example germanium component 150 is shown to include a germanium strip 152 formed on a silicon layer 154 which is in turn formed on a substrate 156. First and second contacts 162 and 166 are shown to be formed at the ends of the germanium strip 152 with first and second conductors 160 and 164.

Germanium generally has higher conductivity than silicon. Accordingly, the strip 152 is relatively conductive in comparison to the layer 154 on which the strip is formed. The strip 152 will thus provide a conductive pathway between the contacts 162, 166.

Such a configuration can be used to test resistivity of intrinsic or doped germanium used in the individual devices 112 and/or the test devices 120. The example configuration 150 can also be used to test for uniformity of selective area growth of the germanium strip 152. Other properties may also be tested.

As further shown in FIG. 4, the example germanium strip 152 is shown to have a length of "L" between the two contacts 162 and 166, and a width of "W." Such dimensions can be varied according to different designs. Moreover, the germanium strip 152 can be doped in various ways. Table 1 lists some non-limiting example configurations for dimensions and doping properties of the germanium strip 152 and the associated structures shown in FIG. 4.

TABLE 1

| Ge strip length | Ge strip width | Ge doping | Contact type |
|---|---|---|---|
| L | W | Intrinsic | N or p-type |
| L | W | n or p-type doped | N or p-type |

In certain embodiments, the length, L, may between about 0.3 and 200 µm and the width, W, may be between about 0.3 and 10 µm, although values outside these ranges are also possible. Non-limiting examples of "L" can be values that are approximately 11.020, 12.010, 18.040, 116.08, and 164.32 µm. Non-limiting examples of "W" can be values that are approximately 1.02 and 4.08 µm. In one embodiment, a strip having the example width of approximately 1.02 µm can be designated as a "narrow" strip. A strip having the example width of approximately 4.08 µm can be designated as a "wide" strip. Additionally, a "very narrow"-width strip can also be formed, with a width that is less than 1.02 µm. The width of the strip 152 and/or the silicon layer 154 may vary along the length in certain embodiments. Width of contacts 162 and 166 can be substantially similar to, or be different from, the width of the corresponding strip 152. For example, the strip may be wide, but the contact may be very narrow. The silicon layer 154 and the germanium strip 152 may have other shapes, sizes, and configurations and need not be linear.

Figure 5:
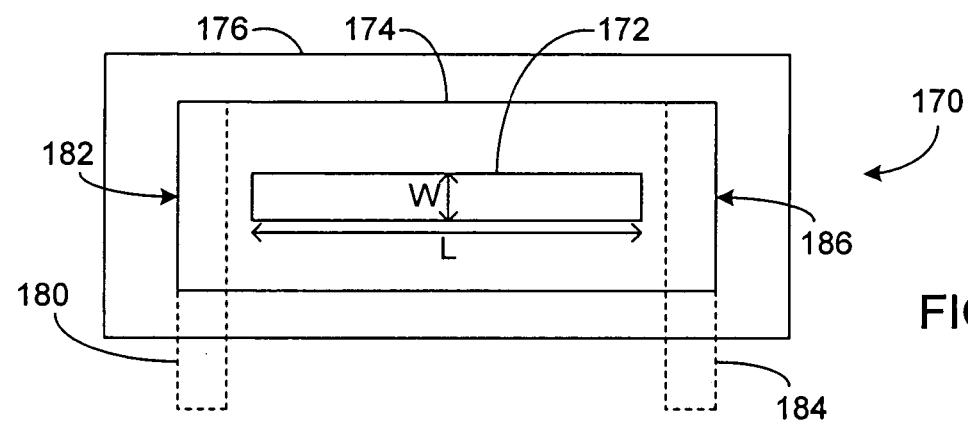
FIG. 5 shows one embodiment of an example germanium component that can be part of the functional germanium device and the test device, where the germanium component includes a resistive germanium strip formed on silicon with electrical contacts formed on silicon.

FIG. 5 shows one embodiment of an example germanium component 170 that can be formed as part of individual devices (112 in FIG. 2A) and test devices (120 in FIGS. 2 and 3). The example germanium component 170 is shown to include a germanium strip 172 formed on a silicon layer 174 which is in turn formed on a substrate 176. First and second contacts 182 and 186 are shown to be formed on the silicon layer proximate to the ends of the germanium strip 172 with first and second conductors 180 and 184. The first and second contact 182 and 186 in the silicon layer may be formed by locally doping the silicon layer. Ohmic contact can be formed between the silicon layer 174 and the germanium strip 172 at the ends of the germanium strip.

As described above, germanium generally has higher conductivity than silicon. Accordingly, the strip 172 is relatively conductive in comparison to the layer 174 on which the strip is formed with the exception of doped silicon portions in the proximity of the ends of the strip. The strip 172 will thus provide a conductive pathway between the contacts 182, 186. The doped silicon portion at the ends of the strip 172 provide for electrical connection from the contacts 182, 186 to the ends of the strip 172.

Such a configuration can be used to test resistivity of intrinsic or doped germanium used in the individual devices 112 and/or the test devices 120. The example configuration 170 can also be used to test for uniformity of selective area growth of the germanium strip 172. The example configuration 170 can also be used to test heterointerface quality of the silicon-germanium interface. Other properties may also be tested.

As further shown in FIG. 5, the example germanium strip 172 is shown to have a length of "L", and a width of "W." Such dimensions can be varied according to different designs. Moreover, the germanium strip 172 can be doped in various ways. Table 2 lists some non-limiting example configurations for dimensions and doping properties of the germanium strip 172 and the associated structures shown in FIG. 5.

TABLE 2

| Ge strip length | Ge strip width | Ge doping | Contact type | Si margin |
|---|---|---|---|---|
| L | W | Intrinsic | n or p-type | $W_{margin}$ |
| L | W | N or p-type doped | n or p-type | $W_{margin}$ |

In certain embodiments, the length, L, may between about 0.3 and 200 µm and the width, W, may be between about 0.3 and 10 μm, although values outside these ranges are also possible. Non-limiting examples of "L" can be values that are approximately 11.020, 12.010, 18.040, 116.08, and 164.32 μm. Non-limiting examples of "W" can be values that are approximately 1.02 and 4.08 μm. In one embodiment, a strip having the example width of approximately 1.02 μm can be designated as a "narrow" strip. A strip having the example width of approximately 4.08 μm can be designated as a "wide" strip. In certain embodiments, the "$W_{margin}$" represents the width of a margin of silicon enclosure about the germanium structure, and may between about 0.1 and 4 μm, although values outside this range is also possible. Non-limiting examples of "$W_{margin}$" can be values that are approximately 1.41 and 2.01 μm. The width of the strip 172 and/or the width of the silicon layer 174 may vary along the length in certain embodiments. Width of contacts 182 and 186 can be substantially similar to, or be different from, the width of the silicon layer 174. For example, the silicon layer 174 may be wide, but the contact may be very narrow. The silicon layer 174 and the germanium strip 172 may have other shapes, sizes, and configurations and need not be linear.

Figure 6:
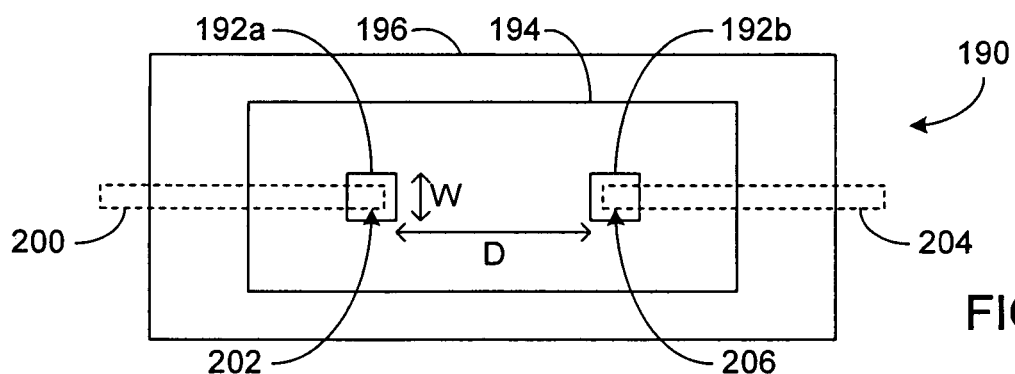
FIG. 6 shows one embodiment of an example germanium component that can be part of the functional germanium device and the test device, where the germanium component includes electrical contacts through separate germanium structures formed on silicon so as to provide a germanium tunnel or diode device.

FIG. 6 shows one embodiment of an example germanium component 190 that can be formed as part of individual devices (112 in FIG. 2A) and test devices (120 in FIGS. 2 and 3). The example germanium component 190 is shown to include isolated first and second germanium regions 192a and 192b formed on a silicon layer 194 which is in turn formed on a substrate 196. A first contact 202 is shown to be formed on the first isolated germanium regions 192a with a first conductor 200; and a second contact 206 is shown to be formed on the second isolated germanium region 192b with a second conductor 204. The isolate germanium regions 192a and 192b regions are referred to as being "isolated" because these germanium regions are physically separated from each other by a portion of the silicon layer 194 such that electrical current flows from the first germanium region 192a to the second germanium region 192b via the portion of the silicon layer 194 disposed therebetween.

Heterojunctions can be formed between the first germanium region 192a and the silicon layer 194 as well as between the second germanium region 192a and the silicon layer. These heterojunctions may include rectifying junctions that electrically operate like a diode.

Such a configuration can be used to test heterojunction or quality of the silicon-germanium interface. The example configuration 190 can also be used to test quality and/or yield of contact to germanium used in the individual devices 112 and/or the test devices 120. The example configuration 190 can also be used to test for uniformity of selective area growth of the germanium islands 192a, 192b. Other properties may also be tested.

As further shown in FIG. 6, the example germanium islands 192 are shown to have a width of "W," and be separated from each other by a distance "D." Such dimensions can be varied according to different designs. Moreover, the germanium islands 192 can be doped in various ways. Table 3 lists some non-limiting example configurations for dimensions and doping properties of the germanium islands 192 and the associated structures shown in FIG. 6.

TABLE 3

| Ge island width | Ge island separation | Si doping | Si margin |
| --- | --- | --- | --- |
| W | D | Undoped | $W_{margin}$ |
| W | D | n or p-type doped | $W_{margin}$ |

In certain embodiments, the width, W, may between about 0.3 and 10 μm and the spacing, D, may be between about 1 and 100 μm, although values outside these ranges are also possible. Non-limiting examples of "W" can be values that are approximately 1.02 and 4.08 μm. Non-limiting examples of "D" can be values that are approximately 1.02, 2.01, 8.04, 16.08, and 64.32 μm. In certain embodiments, the "$W_{margin}$" may between about 0.1 and 10 μm, although values outside this range are also possible. Non-limiting examples of "$W_{margin}$" can be values that are approximately 1.02 and 4.08 μm. The width and shape of the silicon layer may be different as may be the size and shape of the germanium islands, 192a, 192b. The size and shape of the germanium islands 192a, 192b need not be identical.

Figure 7:
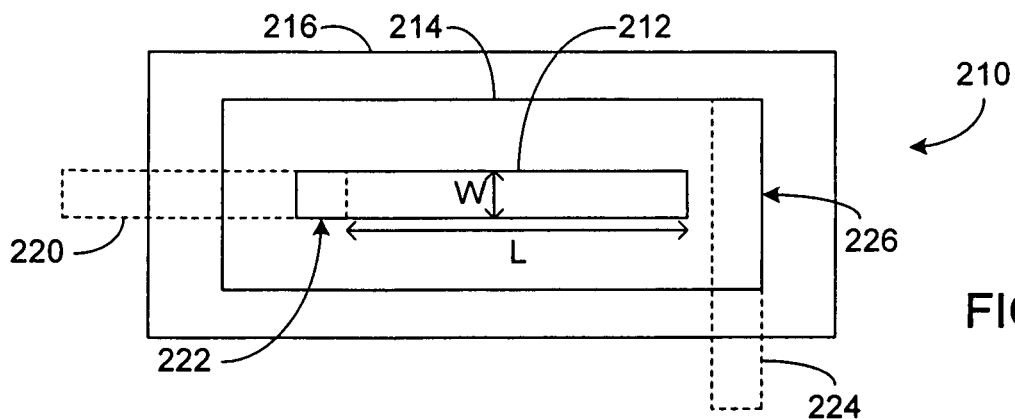
FIG. 7 shows one embodiment of an example germanium component that can be part of the functional germanium device and the test device, where the germanium component includes a resistive germanium strip formed on silicon with one electrical contact formed on one end of the germanium strip and the other electrical contact form on silicon adjacent the other end of the germanium strip.

A wide variety of variations are possible. FIG. 7, for example, shows a germanium component 210 that combines design features of the components 150 and 170 shown in FIGS. 4 and 5, respectively. In particular, the example germanium component 210 is shown to include a germanium strip 212 formed on a silicon layer 214 which is in turn formed on a substrate 216. A first contact 222 is shown to be formed on one end of the germanium strip 212 with a first conductor 220; and a second contact 226 is shown to be formed on the silicon layer 214 proximate to the other end of the germanium strip 212 with a second conductor 224. The second contact 226 in the silicon layer may be formed by locally doping the silicon layer. Ohmic contact is formed between the silicon layer 214 and the germanium strip 212 at the end of the germanium strip.

Such a configuration can be used to test quality and/or yield of contact to germanium used in the individual devices 112 and/or the test devices 120. The example configuration 210 can also be used to test for uniformity of selective area growth of the germanium strip 212. The example configuration 210 can also be used to test heterointerface quality of the silicon-germanium interface.

As further shown in FIG. 7, the example germanium strip 212 is shown to have a width of "W," and a length of "L." Such dimensions can be varied according to different designs. Moreover, the germanium strip 212 and/or the silicon layer 214 can be doped in various ways. Table 4 lists some non-limiting example configurations for dimensions and doping properties of the germanium strip 212 and the associated structures shown in FIG. 7.

TABLE 4

| Ge strip length | Ge strip width | Ge doping | Si doping |
| --- | --- | --- | --- |
| L | W | Undoped | Same doping as Ge |
| L | W | Undoped | n or p-type doped |
| L | W | n or p-type doped | Same doping as Ge |
| L | W | n or p-type doped | Opposite doping as Ge |

In certain embodiments, the length, L, may between about 0.3 and 200 μm and the width, W, may be between about 0.3 and 10 μm, although values outside these ranges are also possible. Non-limiting examples of "L" can be values that are approximately 11.020, 12.010, 18.040, 116.08, and 164.32 µm. Non-limiting examples of "W" can be values that are approximately 1.02 and 4.08 µm. In one embodiment, a strip having the example width of approximately 1.02 µm can be designated as a "narrow" strip. A strip having the example width of approximately 4.08 µm can be designated as a "wide" strip. Additionally, a "very narrow"-width strip can also be formed, with a width that is less than 1.02 µm. As described above, the silicon layer 214 and the germanium strip 212 can have different shapes, sizes, and configurations. For example, the width of the strip 212 and/or the width of the silicon layer 214 may vary along the length in certain embodiments. Other variations are also possible.

Figure 8:
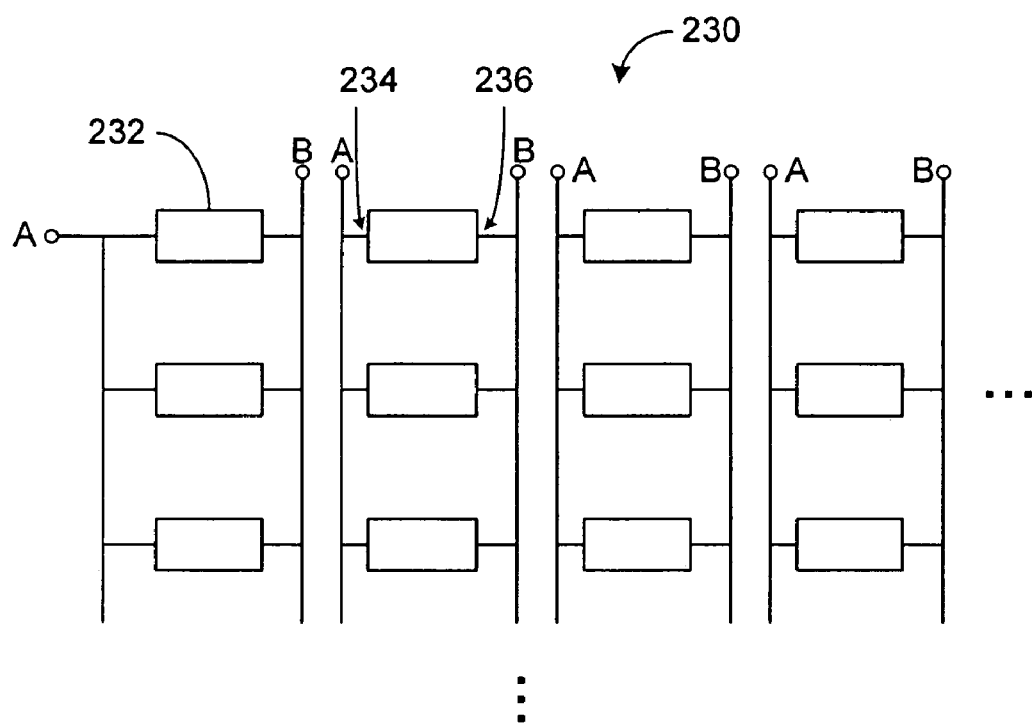
FIG. 8 shows that in one embodiment, the plurality of germanium components of the test devices can be electrically connected in a manner other than in series to allow testing of an electrical parameter that can be manifested in a more pronounced manner when combined in a non-series manner.

FIG. 8 shows that in some embodiments, the germanium components of the test device do not need to be connected in series. For example, in one example test device 230, a plurality of germanium components 232 can be connected in parallel so that first ends 234 of the components 232 are connected to a first conductor (depicted as "A" in FIG. 8), and second ends 236 to a second conductor (depicted as "B"). Such a configuration can be used to test the germanium components based on electrical properties such as, for example, capacitance. Other configurations are also possible.

In some embodiments, the test assembly 104 of FIGS. 1 and 2, and the corresponding test devices 120 (FIGS. 2-8) can be formed anywhere on the semiconductor device 100. As described above, it is preferable in one embodiment to position the test devices 120 at a location that is proximate the array of individual germanium devices 112 so as to allow both of the test and individual devices 120 and 112 to similar fabrication conditions.

Figure 9A:
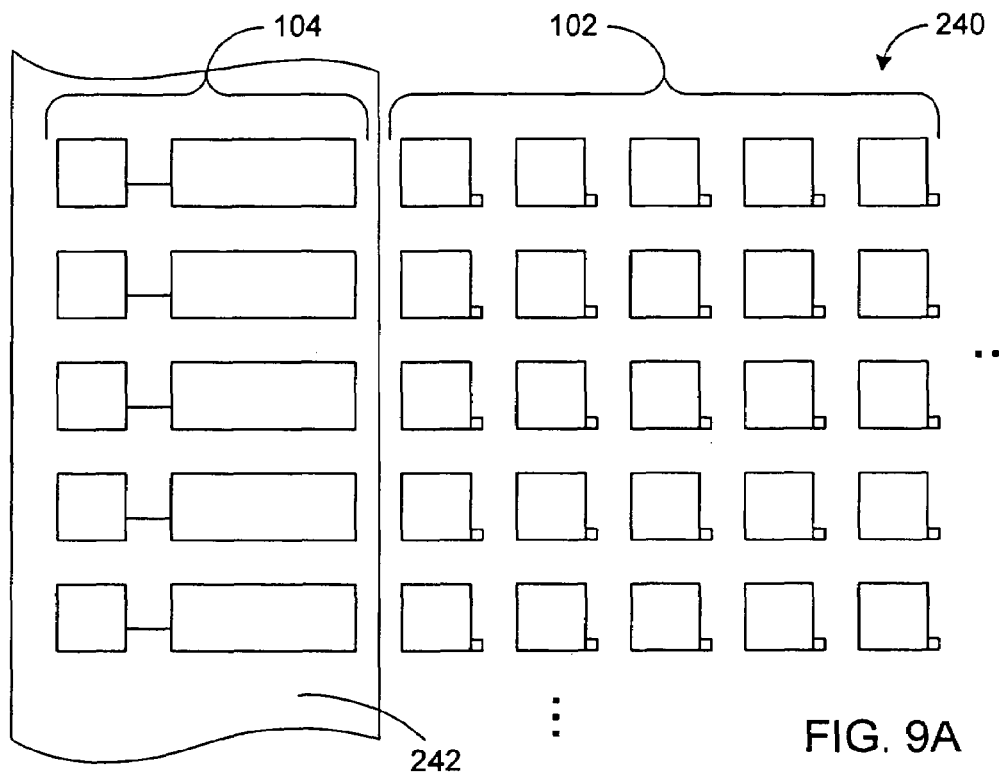
FIG. 9A shows that in one embodiment, the plurality test devices can be positioned on a scribe grid area adjacent the array of functional germanium devices.

FIG. 9A shows that in some embodiments, an arrangement 240 can be configured so that the test assembly 104 is positioned in an area that will be discarded after testing of the wafer, for example, when the wafer is separated into individual dice (with each die including, for example, one array 102 of devices or one device 112). In one embodiment, as shown in FIG. 9A, the test assembly 104 can be formed on a scribe grid area adjacent the array 102. Thus, when the wafer is separated, a cut can be made on a scribe grid lane 242. It will be understood that the scribe grid lane 242 may extend next to or through the test assembly 104. Thus, one can see that in one embodiment, various features of the test assembly 104 described herein can be incorporated as part of a scribe grid process control (SGPC).

An example scribe grid comprise region of the substrate or wafer and/or in layers formed thereon wherein the substrate or wafer is cut when the substrate or wafer to be broken or separated into pieces. Various techniques may be used to break the substrate or wafer including mechanical force. Other methods may also be used.

The test assembly 104 may be included in or near a portion of the scribe grid such that when the substrate or wafer is broken, the test assembly is separated from the plurality of germanium devices 102. The test assembly 104 may also be destroyed in this separation process. In certain embodiments, the portion of the scribe grid is between about 50 and 200 micron wide. In some embodiments, spacing between test devices is not critical, so long as the devices fit within the scribe lane. Dimensions outside these ranges are also possible.

Figure 9B:
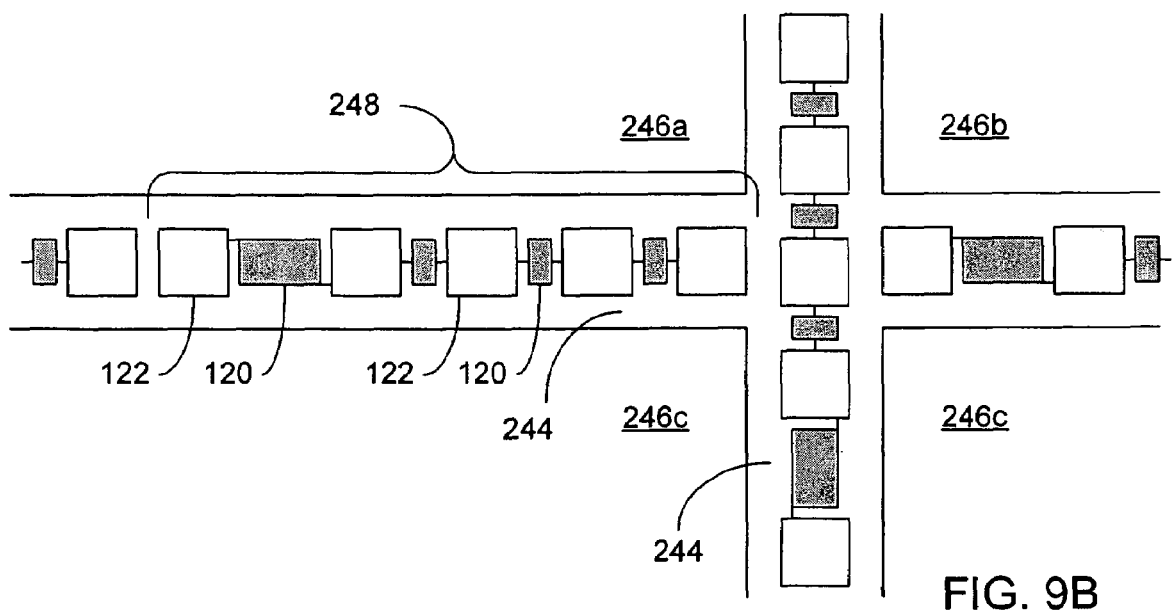
FIG. 9B shows that in one embodiment, the test devices and corresponding pads can be formed in scribe grid lanes between dice.

FIG. 9B shows that in one embodiment, test devices 120 (depicted as shaded rectangles) and corresponding pad 122 can be formed on scribe grid lanes 244 between dice (depicted as 246a to 246d). Thus, the test devices 120 can be destroyed when the dice 246 are separated along the scribe grid lanes 244.

The test devices 120 and corresponding pads 122 can be configured in different ways. In one embodiment, test devices 120 and corresponding pads 122 can be arranged as an assembly 248 in a manner similar to the example configuration described above in reference to FIG. 2B.

FIG. 10 shows one embodiment of a process 250 that can perform quality control of germanium devices using the test devices as described herein. In a process block 252, germanium devices are formed on a wafer. In a process block 254, test devices are formed, in certain embodiments, adjacent or in proximity to the germanium devices. In certain embodiments, both of the functional and test devices are fabricated using substantially same steps, but on different locations on the wafer. These test devices may be formed in a portion or the scribe grid or in proximity thereto. As described herein, the test devices include a plurality of germanium components that are similar at least in some manner to the germanium components of the germanium devices. In a process block 256, an electrical property of the test devices is measured. In a process block 258, a quality parameter of germanium devices is estimated based on the measured electrical property of the test devices. Additional steps may include destruction of the test devices by breaking the wafer into separate dies.

FIG. 11 shows one embodiment of a process 260 that can be configured to allow monitoring and/or tuning of a fabrication process. In a process block 262, a quality parameter of germanium devices is estimated based on a measured electrical property of test devices. In one embodiment, the example process 250 of FIG. 10 can achieve such estimation. In a process block 264, one or more fabrication parameter can be adjusted, if needed or desired, based on the estimated quality parameter.

In some embodiments, fabrication of the germanium components of the individual devices and the test devices, as well as associated structures, can be achieved using known manufacturing techniques. Also, measurement of electrical parameters, such as resistance measurement, can be achieved using known techniques. For example, resistance or associated property can be determined by obtaining a current-voltage (I-V) characteristic of a given component.

Although various embodiments of the invention have been described above with reference to FIGS. 1-11, other embodiments are also possible. In other embodiments, for example, multiple arrays of functional devices may be included on a wafer, each having a corresponding test assembly or a single array of functional devices may be included on the wafer with one or more test assemblies. The functional devices also need not be arranged in an array, e.g., of rows and columns, and may be arranged in different patterns or be arranged irregularly. The number of functional devices may vary as well. The functional devices may be the same or different. In some embodiments, only one functional device is included with a test assembly. The potential functional devices may include transistor, resistors, capacitors, diodes, however, a wide range of other devices are also possible. These devices may be electrical devices, optical devices, electro-optical devices but should not be so limited.

Similarly, the test assembly may vary. For example, one or more test assemblies may be included on a wafer. Different test assemblies on a wafer may be the same or different. The test assemblies may comprises arrays of test devices, however, in some embodiments the test devices are not arranged in an array, e.g., of rows and columns, and may be arranged in different patterns or be arranged irregularly. The number of test devices may vary as well. The test devices in a given test assembly may be the same or different. In some embodiments, only one test device is included in a test assembly. The components different test devices may be the same or different. These components may include resistors, capacitors, diodes, however, a wide range of other components are also possible.

Although in certain preferred embodiments, the functional devices and test devices comprise germanium and silicon, other materials may be employed. Also, the germanium and silicon, or other materials, may be disposed directly on the substrate or may be disposed on one or more layer formed on the substrate. In some embodiments, the germanium or silicon forms part of the substrate.

A wide variety of other variations are possible. For example, additional structural elements may added, elements may be removed or elements may be arranged or configured differently. Similarly, processing steps may be added, removed, or ordered differently. Accordingly, although the above-disclosed embodiments have shown, described, and pointed out the novel features of the invention as applied to the above-disclosed embodiments, it should be understood that various omissions, substitutions, and changes in the form of the detail of the devices, systems, and/or methods shown may be made by those skilled in the art without departing from the scope of the invention. Consequently, the scope of the invention should not be limited to the foregoing description, but should be defined by the appended claims.

What is claimed is:

1. A semiconductor device structure comprising:
   a plurality of functional semiconductor devices formed on a substrate, at least one of said functional semiconductor devices comprising a germanium component;
   at least one test device formed on said substrate, said test device comprising at least one germanium test component, said germanium test component being substantially similar to said germanium component of said functional semiconductor devices, said germanium test component electrically connected between first and second contacts, and test pads electrically connected to said first and second test contacts;
   wherein measurement of an electrical parameter associated with said test device via said test pads provides a measure of a quality of said functional semiconductor devices.

2. The apparatus of claim 1, wherein said substrate comprises silicon.

3. The apparatus of claim 1, wherein said plurality of functional semiconductor devices comprise resistors, diodes, or transistors.

4. The apparatus of claim 1, wherein said at least one semiconductor device having said germanium component comprises an electro-optic device.

5. The apparatus of claim 4, wherein said at least one germanium test component comprises an electro-optic device without an optical input.

6. The apparatus of claim 1, wherein said at least one test device comprises a plurality of germanium test components.

7. The apparatus of claim 6, wherein said germanium test components are connected in series.

8. The apparatus of claim 6, wherein said test device comprises two or more test germanium components.

9. The apparatus of claim 8, wherein said test device comprises ten or more test germanium components.

10. The apparatus of claim 9, wherein said test device comprises 100 or more test germanium components.

11. The apparatus of claim 1, wherein said germanium component comprises a silicon-germanium-silicon assembly having first and second silicon ends and a germanium region disposed therebetween, said first and second contacts associated with said first and second silicon ends respectively.

12. The apparatus of claim 1, wherein said germanium component comprise a germanium-silicon-germanium assembly comprising first and second germanium regions with silicon disposed therebetween, said first and second contacts associated with said first and second germanium ends.

13. The apparatus of claim 1, wherein said germanium component comprises a germanium-silicon assembly having a germanium end and a silicon end, said first contact associated with said germanium end and said second contact associated with said silicon end.

14. The apparatus of claim 1, wherein said germanium test component comprises a germanium strip having first and second ends, said first and second test contacts formed with said first and second ends, respectively.

15. The apparatus of claim 14, wherein said electrical parameter comprises a total resistance between the first and second test contacts.

16. The apparatus of claim 1, wherein said germanium test component comprises first and second isolated germanium regions disposed on silicon, said first and second contacts formed with said first and second isolated germanium regions, respectively.

17. The apparatus of claim 16, wherein said electrical parameter comprises a current between the first and second test contacts.

18. The apparatus of claim 1, wherein said substrate comprises a wafer.

19. The apparatus of claim 18, wherein said test device is formed on a portion of a scribe grid lane of said wafer.

20. The apparatus of claim 1, wherein a plurality of said test devices are interspersed between said test pads, so that electrical measurement performed on two neighboring test pads measures an electrical property of one or more test devices between said two neighboring test pads.

21. An apparatus for testing a device having one or more germanium components formed on a substrate, comprising:
   at least one germanium test component formed on said substrate, said test germanium component being substantially similar to said one or more germanium components, said at least one germanium test component electrically connected between first and second test contacts;
   wherein measurement of an electrical parameter between said first and second test contacts provides a value that is indicative of a quality of said device.

* * * * *